US009187676B2

(12) United States Patent
Nakayama et al.

(10) Patent No.: US 9,187,676 B2
(45) Date of Patent: Nov. 17, 2015

(54) PRODUCTION PROCESS OF POLYIMIDE FILM LAMINATE, AND POLYIMIDE FILM LAMINATE

(75) Inventors: Tomonori Nakayama, Ube (JP); Kenji Sonoyama, Ube (JP); Takeshige Nakayama, Ube (JP)

(73) Assignee: Ube Industries, Ltd. (JP)

( * ) Notice: Subject to any disclaimer, the term of this patent is extended or adjusted under 35 U.S.C. 154(b) by 493 days.

(21) Appl. No.: 13/810,489

(22) PCT Filed: Jul. 21, 2011

(86) PCT No.: PCT/JP2011/067175
§ 371 (c)(1),
(2), (4) Date: Jan. 16, 2013

(87) PCT Pub. No.: WO2012/011607
PCT Pub. Date: Jan. 26, 2012

(65) Prior Publication Data
US 2013/0115473 A1 May 9, 2013

(30) Foreign Application Priority Data
Jul. 22, 2010 (JP) ................................. 2010-165366

(51) Int. Cl.
| B32B 27/00 | (2006.01) |
| C09D 177/10 | (2006.01) |
| C08G 73/10 | (2006.01) |
| B32B 27/28 | (2006.01) |
| H01L 31/0392 | (2006.01) |
| C08L 79/08 | (2006.01) |
| H05K 1/03 | (2006.01) |
| C08J 7/04 | (2006.01) |
| B32B 27/06 | (2006.01) |

(52) U.S. Cl.
CPC ............ *C09D 177/10* (2013.01); *B32B 27/281* (2013.01); *C08G 73/1067* (2013.01); *C08J 7/047* (2013.01); *C08L 79/08* (2013.01); *H01L 31/03926* (2013.01); *H05K 1/0393* (2013.01); *C08J 2379/08* (2013.01); *H05K 2201/0154* (2013.01); *Y02E 10/50* (2013.01); *Y10T 156/10* (2015.01); *Y10T 428/31721* (2015.04)

(58) Field of Classification Search
USPC ........................ 528/322, 336, 353; 428/473.5
See application file for complete search history.

(56) References Cited

U.S. PATENT DOCUMENTS

| 5,115,090 A | 5/1992 | Sachdev et al. |
| 5,741,598 A | 4/1998 | Shiotani et al. |
| 2004/0162363 A1 | 8/2004 | Mochizuki et al. |
| 2010/0130628 A1 | 5/2010 | Yamaguchi et al. |
| 2010/0207293 A1 | 8/2010 | Nakayama et al. |
| 2010/0291377 A1 | 11/2010 | Takabayashi et al. |

FOREIGN PATENT DOCUMENTS

| CN | 101679632 | | 3/2010 |
| EP | 0 189 643 | A2 | 8/1986 |
| EP | 0 455 571 | A2 | 11/1991 |
| EP | 0 527 100 | A2 | 2/1993 |
| EP | 2 039 715 | A1 | 3/2009 |
| JP | 03-157427 | A | 7/1991 |
| JP | 05-315630 | A | 11/1993 |
| JP | 2005-138310 | A | 6/2005 |
| JP | 2006-274130 | A | 10/2006 |
| JP | 2007-332369 | A | 12/2007 |
| JP | 2008-115377 | A | 5/2008 |
| JP | 2008-239887 | A | 10/2008 |
| JP | 2009-091573 | A | 4/2009 |
| WO | 2008/004496 | A1 | 1/2008 |

OTHER PUBLICATIONS

Supplementary European Search Report dated Dec. 18, 2013 for European Patent Application No. 11809768.2.
Chinese Office Action dated Feb. 28, 2014 for corresponding Chinese Application No. 201180036232.7.
Jung, J-M. et al., "Characterization of Polymide: Application of Hydrolysis and Reactive-Pyrolysis for Composition Analysis," *Polymer Science and Technology*, Feb. 2005, vol. 16, No. 1, pp. 93-100 and 1 sheet of partial English translation.
Geng, M.Z. et al., excerpt from *Engineering Plastic Handbook*, Oct. 31, 2004, first edition (China Machine Press, Beijing) pp. 10-13 with one page brief English summary from the corresponding Chines Official Action.

*Primary Examiner* — Terressa Boykin
(74) *Attorney, Agent, or Firm* — DLA Piper LLP (US)

(57) ABSTRACT

A process for producing a polyimide film laminate includes a substrate and a polyimide film, which includes forming a coating film including a polyamic acid solution composition on the surface of a substrate to produce a laminate composed of the substrate and the polyamic acid solution composition, heating the laminate composed of the substrate and the polyamic acid solution composition at a temperature ranging from at least 150 to 200° C. for 10 minutes or longer, and then heating the heated laminate at a temperature up to 400 to 550° C.

14 Claims, No Drawings

PRODUCTION PROCESS OF POLYIMIDE FILM LAMINATE, AND POLYIMIDE FILM LAMINATE

CROSS-REFERENCE TO RELATED APPLICATIONS

This application is based upon and claims the benefit of priority from Japanese Patent Application No. 2010-165366 filed on Jul. 22, 2010, at the Japanese Patent Office, the disclosure of which is incorporated herein by reference.

TECHNICAL FIELD

The present invention relates to a production process of a polyimide film laminate where a polyimide film is stacked on a substrate. More specifically, the present invention relates to a production process of a polyimide film laminate, including coating a substrate with a polyamic acid solution composition composed of a polyamic acid having a specific chemical formulation and a specific mixed solvent, and then heat-treating the obtained laminate under specific conditions.

BACKGROUND ART

A polyimide using, as a tetracarboxylic acid component, 3,3',4,4',-biphenyltetracarboxylic dianhydride (hereinafter, simply referred to as s-BPDA) and/or pyromellitic dianhydride (hereinafter, simply referred to as PMDA) and using, as a diamine component, p-phenylenediamine (hereinafter, simply referred to as PPD) is excellent in heat resistance, mechanical strength, dimensional stability and the like, and therefore is being used for various applications.

However, when obtaining a laminate having a substrate and a polyimide film by coating the substrate with a polyamic acid solution composition having the above-described chemical formulation and heat-treating the coating, bubbling or bulging may occur, and a problem arises in the formability. Therefore, a polyimide film having this chemical formulation is usually obtained by a method of coating a polyamic acid solution composition on a substrate, heating/drying the obtained coating to form a self-supporting film, separating the self-supporting film from the substrate, and further subjecting the film to a heating imidation treatment.

On the other hand, when obtaining a laminate having a substrate and a polyimide film by coating a substrate with a polyamic solution composition having the above-described chemical formulation and heat-treating the coating, in addition to the problem in formability that bubbling or bulging may occur, the obtained polyimide film is may poor in characteristics such as heat resistance. Above all, in the case of using a polyamic acid solution composition composed of a polyamic acid having a relatively low molecular weight, which is easy to handle and facilitates suitable formation of a coating film, there is a problem that the obtained polyimide film has reduced heat resistance.

Patent Document 1 describes a production process of a polyimide film, where a specific component is employed for a part of the above-described chemical formulation and the formability is thereby improved while suppressing reduction in the characteristics.

Patent Document 2 describes a production process of a polyimide film, where a solution of a polyamic acid solution composition having the above-described chemical formulation is combined with a specific organic polar solvent to obtain a mixed solvent and the formability is thereby improved, making it possible to obtain a polyimide film with excellent characteristics.

In these documents, as for the solvent, an organic polar solvent capable of dissolving a polyamic acid is suitably used, but a mixed solvent of such a solvent and a solvent azeotropic with water is not described.

Patent Document 3 suggests that for the purpose of adjusting the degree of imide ring closure, it is also possible to employ one of the methods where heating is performed, for example, by allowing a substance having dehydration action, such as molecular sieve, to be present in varnish, is performed in the presence of an azeotropic solvent such as toluene, or is performed under reduced pressure and water generated along with imidation is thereby removed to the outside of the system, or employ two or more of these methods in combination.

Patent Document 4 describes a technique of coating a polyimide precursor on a supporting substrate (substrate) such as glass, subjecting the coating to a heating imidation treatment to form a heat-resistant base substrate (polyimide film), stacking a transparent electrode layer, an amorphous silicon layer, a back plate layer and the like thereon, further forming a protective layer, and performing separation between the supporting substrate and the heat-resistant base substrate to obtain a thin-film solar cell having flexibility, and suggests a problem that if the heat treatment at the formation of the heat-resistant base substrate (polyimide film) is insufficient, an outgas may be generated when forming the amorphous silicone layer.

In order to solve the problem above, Patent Document 4 has proposed to form the heat-resistant base substrate by two layers of a polyimide film and a release resin layer (polyamic acid) for bonding the polyimide film. However, formation two layers is not economical because of increase in the steps and also requires a complicated control. Furthermore, the release resin layer needs to be formed of a polyamic acid, and therefore the problem similar to that encountered at the formation of a polyimide film is not satisfactorily solved.

RELATED ART (Patent Document 1) Japanese Unexamined Patent Publication (Kokai) No. 2007-332369
(Patent Document 2) Japanese Unexamined Patent Publication (Kokai) No. 2009-91573
(Patent Document 3) Japanese Unexamined Patent Publication (Kokai) No. 3-157427
(Patent Document 4) Japanese Unexamined Patent Publication (Kokai) No. 5-315630

SUMMARY OF THE INVENTION

An object of the present invention is to provide a production process of a polyimide film laminate, where a polyamic acid solution composition using, as a tetracarboxylic acid component, 3,3',4,4',-biphenyltetracarboxylic dianhydride and/or pyromellitic dianhydride and using, as a diamine component, p-phenylenediamine is coated on the substrate and then heat-treated and a laminate having the substrate and a polyimide film can be thereby formed with good formability while suppressing bubbling or bulging. The polyimide film of this laminate is improved in characteristics such as heat resistance and when another material is further stacked on the polyimide film of the laminate, a problem such as outgas attributable to the polyimide film can be reduced.

The present invention relates to the following items.

(1) A process for producing a polyimide film laminate, comprising:

forming a coating film made of a polyamic acid solution composition, in which a polyamic acid having a repeating unit represented by the following chemical formula (1) is dissolved in a mixed solvent containing an organic polar solvent and a solvent azeotropic with water, the ratio of the solvent azeotropic with water in all solvents being from 5 to 35 mass %, on a surface of a substrate to obtain a laminate having the substrate and the polyamic acid solution composition, heat-treating the laminate having the substrate and the polyamic acid solution composition at least at a temperature ranging from more than 150° C. to less than 200° C. for 10 minutes or more, and then heat-treating the laminate in a temperature range with a maximum temperature of 400 to 550° C. to obtain a laminate having the substrate and a polyimide film:

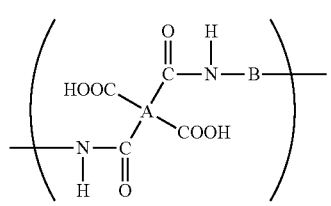

Chemical formula (1)

wherein 75 mol % or more of A of chemical formula (1) is a tetravalent unit based on a biphenyl structure represented by the following chemical formula (2) and/or a tetravalent unit based on a benzene ring structure represented by the following chemical formula (3), and 75 mol % or more of B of chemical formula (1) is a divalent unit based on a phenyl structure represented by the following chemical formula (4):

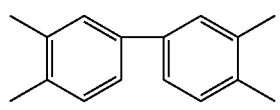

Chemical formula (2)

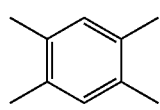

Chemical formula (3)

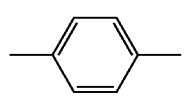

Chemical formula (4)

(2) The production process of a polyimide film laminate as described in item 1 above, wherein the logarithmic viscosity of the polyamic acid in the polyamic acid solution composition is 2.0 dL/g or less.

(3) The production process of a polyimide film laminate as described in item 1 or 2 above, wherein the thickness of the obtained polyimide film is 40 μm or less.

(4) The production process of a polyimide film laminate as described in any one of items 1 to 3 above, wherein another material is further stacked on the polyimide film surface of the polyimide film laminate to obtain a polyimide film laminate having the substrate, the polyimide film and the another material.

(5) The production process of a polyimide film laminate as described in item 4 above, wherein the substrate is separated from the polyimide film laminate having the substrate, the polyimide film and the another material to obtain a polyimide film laminate having the polyimide and the another material.

(6) A polyimide film laminate having a substrate and a polyimide film, which is obtained by the production process described in any one of items 1 to 4 above.

(7) A polyimide film laminate, which is obtained by further stacking another material on the polyimide film surface of the polyimide film laminate described in item 6 above.

(8) A laminate of a polyimide film and another material, which is obtained by separating the substrate from the polyimide film laminate described in item 7 above.

According to the production process of a polyimide film laminate of the present invention, a polyamic acid solution composition using, as a tetracarboxylic acid component, 3,3', 4,4',-biphenyltetracarboxylic dianhydride and/or pyromellitic dianhydride and using, as a diamine component, p-phenylenediamine is coated on a substrate and heat-treated, whereby a laminate having a substrate and a polyimide film can be obtained with good formability while suppressing bubbling or bulging. The polyimide film of this laminate is improved in characteristics such as heat resistance and when another material is further stacked on the polyimide film of the laminate, a problem such as outgas attributable to the polyimide film can be reduced.

MODE FOR CARRYING OUT THE INVENTION

The polyamic acid composition for use in the production process of the present invention contains a polyamic acid as a polyimide precursor, and the polyamic acid is a polyamic acid having a repeating unit represented by chemical formula (1). That is, 75 mol % or more, preferably 80 mol % or more, more preferably 90 mol % or more, still more preferably 100 mol %, of the tetracarboxylic acid component constituting the polyamic acid is composed of 3,3',4,4'-biphenyltetracarboxylic acids and/or pyromellitic acids, and 75 mol % or more, preferably 80 mol % or more, more preferably 90 mol % or more, still more preferably 100 mol %, of the diamine component is composed of p-phenylenediamine.

Incidentally, the 3,3',4,4'-biphenyltetracarboxylic acids or pyromellitic acids are a compound capable of constituting the tetracarboxylic acid component of the polyamic acid, such as tetracarboxylic acids thereof, acid anhydrides thereof and alcohols esterification products thereof.

In the present invention, the tetracarboxylic acid component other than 3,3',4,4'-biphenyltetracarboxylic acids and/or pyromellitic acids is not limited, but suitable examples thereof include 2,3,3',4-biphenyltetracarboxylic acids, 3,3',4, 4'-benzophenonetetracarboxylic acids, 2,3,6,7-naphthalenetetracarboxylic acids, 4,4'-oxydiphthalic acids, and 3,3',4,4'-diphenylsulfonetetracarboxylic acids.

In the present invention, the diamine component other than p-phenylenediamine is not limited, but suitable examples thereof include m-phenylenediamine, diaminodiphenyl ether, diaminotoluene, diaminonaphthalene, diaminodiphenylmethane, and diaminodiphenylsulfone.

In preparing the polyamic acid, conventionally known methods or conditions for the preparation of a polyamic acid can be suitably employed. Although this is therefore not particularly limited, the polyamic acid solution is preferably obtained, for example, as a uniform polyamic acid solution by reacting a tetracarboxylic dianhydride and a diamine with stirring in an organic solvent at a concentration to give a solid content concentration of approximately 5 to 50 mass % in terms of polyimide, at a temperature of preferably 100° C. or less, more preferably 80° C. or less, so as to keep an amide bond and a carboxyl group of the polyamic acid from imidation, for 0.1 hours to tens of hours. If the solid content concentration in terms of polyimide is less than 5 mass %, a large amount of a solvent is used which is not economical, whereas if the solid content concentration exceeds 50 mass %, the viscosity becomes high and handling or the like tends to be difficult.

As the organic polar solvent for use in the preparation of the polyamic acid, conventionally known organic polar solvents can be suitably used. For example, an organic polar solvent such as N-methyl-2-pyrrolidone, N,N-dimethylformamide, N,N-dimethylacetamide, cresol, N,N-dimethylsulfoxide, N-methylcaprolactam, methyl triglyme, methyl diglyme and sulfolane may be suitably used. Also, as the organic solvent for use in the preparation of the polyamic acid, a mixed solvent constituting the polyamic acid solution composition used in the production process of the present invention may be previously used for the reaction solvent. The mixed solvent is described later.

The molecular weight of the polyamic acid contained in the polyamic acid solution composition for use in the present invention is not particularly limited.

Usually, when producing a polyimide film, a relatively high molecular weight polyamic acid having a logarithmic viscosity exceeding 2.0 dL/g is used so as to achieve sufficient characteristics. On the other hand, if a relatively low molecular weight polyamic acid having a logarithmic viscosity of 2.0 dL/g or less is used, a polyimide film satisfying the characteristics that should be obtained by the above-described chemical formulation can be hardly formed. In particular, it is difficult to form a polyimide film exhibiting high heat resistance (kept from thermal decomposition and reduced in the generation of an outgas) at a temperature of 500° C. or more.

However, by employing the present invention, a particularly preferred effect can be achieved in that even in the case of using a relatively low molecular weight polyamic acid having a logarithmic viscosity of 2.0 dL/g or less, preferably 1.5 dl/g or less, more preferably 1.0 dL/g or less, still more preferably 0.8 dL/g or less, and 0.2 dL/g or more, preferably 0.3 dL/g or more, which is usually not used, formation of a polyimide film exhibiting a high heat resistance (kept from thermal decomposition and reduced in the generation of an outgas) also at a temperature of 500° C. or more is facilitated.

Incidentally, the polyamic acid solution composition of the present invention has good solution stability and, as long as precipitation of a polymer component or gelling of the solution does not occur and a uniform solution state can be maintained, an amide bond and a carboxyl group of the polyamic acid may be partially imidated.

As the mixed solvent of the polyamic acid solution composition for use in the production process of the present invention, a mixed solvent containing an organic polar solvent and a solvent azeotropic with water, where the ratio of the solvent azeotropic with water in all solvents is 5 mass % or more, preferably 10 mass % or more, and 35 mass % or less, preferably 30 mass % or less, more preferably 25 mass % or less, is used. If the ratio of the solvent azeotropic with water in all solvents is less than 5 mass %, the formability cannot be sufficiently improved, whereas if the ratio exceeds 35 mass %, this is not preferred because uniform dissolution may not be obtained or solution stability of the polyamic acid solution composition may be reduced.

As the organic polar solvent in the mixed solvent, conventionally known organic polar solvents that can be used for the preparation of a polyamic acid may be suitably used, and examples thereof include an amide solvent such as N,N-dimethylformamide, N,N-dimethylacetamide, N-methyl-2-pyrrolidone and N-methylcaprolactam; a sulfur atom-containing solvent such as dimethylsulfoxide, hexamethylphosphormamide, dimethylsulfone, tetramethylenesulfone and dimethyltetramethylenesulfone; a phenol solvent such as cresol, phenol and xylenol; a lactone solvent such as γ-butyrolactone; and a ketone solvent such as isophorone, cyclohexanone and 3,3,5-trimethylcyclohexanone. An aprotic organic polar solvent is preferred, and a solvent having a boiling point of 180° C. or more is more preferred. Incidentally, in the present invention, the organic polar solvent does not encompass a solvent azeotropic with water.

The solvent azeotropic with water may be sufficient if it is a solvent capable of azeotropically boiling with water, but suitable examples thereof include an aromatic ring-containing hydrocarbon compound and a heterocyclic ring-containing compound, such as toluene, xylene and pyridine. The boiling point (as a pure substance) of the solvent azeotropic with water is preferably from 100° C. to less than 180° C., more preferably from 110° C. to less than 170° C.

With respect to the combination of the mixed solvent for use in the present invention, among others, it is preferred to use, as the organic polar solvent, one or more organic polar solvents selected from the group consisting of N,N-dimethylformamide, N,N-dimethylacetamide and N-methyl-2-pyrrolidone and use, as the solvent azeotropic with water, one or more solvents selected from the group consisting of toluene, xylene and pyridine.

In the present invention, the method for obtaining the mixed solvent may be a method where a polyamic acid solution composition prepared using the mixed solvent from the beginning at the preparation of the composition is used as it is, a method where only an organic polar solvent is used at the preparation of the polyamic acid solution composition and a predetermined amount of a solvent azeotropic with water is added to the obtained polyamic acid solution composition and uniformly mixed, or a method where after once preparing a polyamic acid, the obtained polyamic acid is isolated, for example, by a method of pouring the polyamic acid in a poor solvent therefor, such as methanol, to cause deposition (precipitation) and this polyamic acid is dissolved in the mixed solvent of the present invention.

The polyamic acid composition suitably used for the production process of the present invention has a solid content concentration of, in terms of polyimide, from 5 to 50 mass %, preferably from 10 to 45 mass %, more preferably from 15 to 40 mass %. If the solid content concentration is less than 5 mass %, a large amount of a solvent is used and this is uneconomical, whereas if the solid content concentration exceeds 50 mass %, the viscosity becomes high at room temperature and handling or the like when coating the composition on a substrate tends to be difficult.

The polyamic acid solution composition for use in the present invention is composed of the above-described polyamic acid as a polyimide precursor and the above-described mixed solvent for dissolving the polyamic acid, and, if desired, a fine inorganic or organic filler such as fine powder silica, boron nitride, alumina and carbon black may be further blended, or, if desired, other blending components may be further blended. Other blending components are determined according to usage or required performance, but, for example, a plasticizer, a weather-resisting agent, an antioxidant, a thermal stabilizer, a lubricant, an antistatic agent, a brightening agent, a coloring agent such as dye and pigment, an electrically conducting agent such as metal powder, a release agent, a surface-treating agent, a viscosity-adjusting agent, a coupling agent and a surfactant may be suitably blended. Such a blending component may be previously blended in the solution composition or may be added and blended in use.

Incidentally, when a fine filler is blended in the polyamic acid solution composition, generation of bubbling or bulging in the film production process is liable to be suppressed and therefore, its blending is sometimes advantageous for enhancing the formability. In the production process of a polyimide film using a polyamic acid solution composition of the present invention, when a polyamic acid solution composition having blended therein a fine filler is used, the suppressing effect of the filler on bubbling or bulging and the suppressing effect of the mixed solvent on bubbling are synergistically combined, and the formability is more enhanced. Even when a fine filler is blended, if a mixed solvent is not used, the film-forming property is not always sufficiently enhanced and the film thickness or film-forming conditions may be limited, or bubbling may not be suppressed depending on the film thickness or film-forming conditions. Furthermore, other problems such as film cracking may in at the film production.

The production process of a polyimide film laminate of the present invention is characterized by forming a coating film made of the above-described polyamic acid solution composition on a surface of a substrate to obtain a laminate having a substrate and a polyamic acid solution composition, heat-treating the laminate having the substrate and the polyamic acid solution composition at least at a temperature ranging from more than 150° C. to less than 200° C. for 10 minutes or more, and then heat-treating the laminate in a temperature range with a maximum temperature of 400 to 550° C. to obtain a laminate having the substrate and a polyimide film.

In the present invention, the substrate is not particularly limited by the shape or construction material as long as it allows for coating of the polyamic acid on the surface to form a coating film and has a dense structure substantially incapable of passing a liquid or a gas, and various shapes or materials can be employed according to usage.

The substrate may be a substrate for film formation, such as belt, roll and metal mold, which is known per se and used when producing a normal film, may be a circuit board or electronic component on which surface a polyimide film is formed as a protective film or the like, may be a component or product in which a film is formed on a surface of a sliding component or the like, or may be the other party film when forming a polyimide film to make a multilayered film. Furthermore, in the present invention, the substrate may be also preferably a glass plate used at the time of coating a polyamic acid solution composition on a glass plate as in Patent Document 3, performing a heating imidation treatment to form a polyimide film laminate, and further stacking thereon, for example, another material such as a transparent electrode layer, amorphous silicon layer and back plate layer.

As to the coating method when forming a coating film made of the polyamic acid solution composition on a substrate surface, for example, a method that is known per se, such as spraying method, roll coating method, spin coating method, bar coating method, inkjet method, screen printing method and slit coating method, may be appropriately employed. The coating film made of the polyamic acid solution composition and formed on a substrate surface may be defoamed, for example, by a method of heating the coating film at a relatively low temperature under reduced pressure.

In the production process of a polyimide film laminate of the present invention, the thus-formed laminate having a substrate and a polyamic acid solution composition is heat-treated at least at a temperature ranging from more than 150° C., preferably more than 160° C., still more preferably more than 160° C. and less than 200° C., preferably less than 195° C., more preferably less than 190° C., for 10 minutes or more, preferably 20 minutes or more, more preferably 30 minutes or more, and usually 3 hours or less, preferably 2 hours or less. Subsequently, the laminate is heat-treated in a temperature range with a maximum temperature of 400° C. or more, preferably 420° C. or more, more preferably 450° C. or more, and 550° C. or less, preferably 500° C. or less, more preferably 480° C. or less, for, although not limited, from 0.01 to 3 hours, preferably on the order of 0.1 to 1 hour, to form the polyamic acid solution composition into a polyimide film, whereby a laminate having a substrate and a polyimide film is obtained.

In the production process of a polyimide film laminate of the present invention, as long as the above-described heating conditions are satisfied, other conditions in the heat treatment are not particularly limited, but a stepwise heat treatment of preferably first removing the solvent at a relatively low temperature of 150° C. or less, preferably 140° C. or less, and then gradually raising the temperature to the maximum heat treatment temperature is suitable. The conditions of such a heat treatment are preferably determined appropriately according to, in particular, the thickness of the polyimide film.

In this viewpoint, for example, it is one preferred heat treatment to first remove the solvent at a relatively low temperature of 150° C. or less, preferably 140° C. or less, perform a heat treatment at a temperature ranging from more than 150° C. to less than 200° C. for 10 minutes or more, then perform a heat treatment temperature of 200° C. or more and less than 400° C., preferably 300° C. or less, and further perform a heat treatment in a temperature range with a maximum temperature of 400° C. or more and preferably 500° C. or less for, although not limited, from 0.01 to 3 hours to form the polyamic acid solution composition into a polyimide film.

In the production process of a polyimide film laminate of the present invention, the substrate and the polyimide film are not particularly limited in their thickness, but the thickness of the polyimide film is preferably from 1 to 150 μm, more preferably from 1 to 50 μm, still more preferably from 1 to 40 μm, yet still more preferably on the order of 1 to 30 μm. If the thickness is large, bulging or bubbling is more likely to occur and for preventing this occurrence, the conditions must be selected, for example, to perform the removal by drying of the solvent for a longer time or perform the heat treatment for a longer time or at a lower temperature rise rate, as a result, the production efficiency may be reduced. Accordingly, in the production process of a polyimide film laminate of the present invention, the thickness of the obtained polyimide film is suitably 40 μm or less, preferably 30 μm or less.

In the production process of a polyimide film laminate of the present invention, thanks to stable film-forming property (formability), a polyimide film laminate having a substrate and a polyimide film with high characteristics can be obtained. Moreover, in the case where another material is further stacked on the polyimide film surface of the polyimide film laminate and the another material must be further heat-treated, even under harsher conditions (for example, a higher temperature condition of 500 to 600° C.) than the heat treatment conditions at the production of the polyimide film, the polyimide film exhibits stable characteristics such as heat resistance and is free from a problem such as outgas. Therefore, this is a very ideal production process.

Incidentally, when the polyimide film laminate of the present invention is used, a polyimide film laminate having a substrate, polyimide and another material, where another material is further stacked on the polyimide film surface, can be suitably obtained, and furthermore, a polyimide film laminate having polyimide and another material can be also suitably obtained by separating the substrate from the polyimide film laminate having the substrate, the polyimide and the another material. Another material is not particularly limited, but suitable examples thereof include a functional film made of an inorganic material or a metal material, such as transparent electrode layer, amorphous silicon layer and back plate layer. The polyimide film laminate having polyimide and another material obtained by stacking such another material can be suitably used as a component of a solar cell, a display device or the like.

Furthermore, in the production process of the present invention, a polyimide film enjoying an improved film-forming property (formability) and having the above-described very excellent mechanical characteristics can be obtained, and therefore, this process can be suitably employed in the production of, for example, an overcoat film or a copper-clad laminate board such as two-layer CCL obtained by lamination with a copper foil, particularly a seamless belt obtained by applying the process to a centrifugal molding method or the like.

In the production of a seamless belt, the above-described film-forming process and film-forming conditions can be suitably employed except that an inner or outer circumferential surface of a cylindrical metal mold is used as the substrate and the film production (formation) is performed while rotating the metal mold. However, because the seamless belt is larger in the film thickness than the normal film thickness (the normal film thickness is more than 40 μm, particularly on the order of 50 to 150 μm) and contains a relatively large amount of a filler in many cases, the conditions are preferably selected, for example, to perform the removal by drying of the solvent for a longer time or perform the heat treatment for a longer time or at a lower temperature rise rate.

Furthermore, in the seamless belt, a filler or the like of various types is blended according to its usage. The blending component is preferably blended by adding it to the polyamic acid solution. The blending component may be also previously blended in the solution before reaction when preparing the polyamic acid solution.

For example, in the case of using a polyimide endless tubular belt as a fixing belt of a copier, silica, boron nitride, alumina or the like is suitably blended so as to enhance the thermal conductivity. Also, in order to prevent fusion of a toner attached to the surface, a non-adhesive layer made of a fluororesin such as polytetrafluoroethylene, tetrafluoroethylene-perfluoroalkylvinyl ether copolymer and tetrafluoroethylene-hexafluoropropylene copolymer may be stacked on the belt surface.

In addition, in the case of using a polyimide endless tubular belt as a transfer belt of a copier, carbon black or the like is suitably blended so as to impart a semiconducting property.

EXAMPLES

The present invention is described in greater detail below. The present invention should not be construed as being limited to the following Examples.

Abbreviations of the compounds used in Examples stand for the followings.
PPD: p-Phenylenediamine
s-BPDA: 3,3',4,4'-Biphenyltetracarboxylic dianhydride
The evaluation methods/measurement methods used in Examples are as follows.
(Logarithmic Viscosity of Solution Composition)
As for the logarithmic viscosity ($\eta_{inh}$), a solution obtained by uniformly dissolving a polyamic acid solution in N-methyl-2-pyrrolidone to have a polyamic acid concentration of 0.5 g/100 ml-solvent was prepared, and the solution was measured for the time of flow ($T_1$) at 30° C. by using Canon Fenske No. 100. The logarithmic viscosity was calculated according to the following formula by using the time of flow ($T_0$) of a blank solvent. The unit is dL/g.

$$\text{Inherent viscosity} = \{1n(T_1/T_0)\}/0.5$$

(Solid Content Concentration)
The solid content concentration of the polyamic acid solution is a value measured by drying the polyamic acid solution at 350° C. for 30 minutes and determined according to the following formula from the weight W1 before drying and the weight W2 after drying.

$$\text{Solid content concentration (wt \%)} = \{(W1-W2)/W1\} \times 100$$

(Solution Viscosity)
The solution viscosity at 30° C. was measured using a E-type viscometer manufactured by Tokimec Inc.
(Solution Stability of Polyamic Acid Solution Composition)
The solution stability of the polyamic acid solution was evaluated by measuring a polyamic acid solution prepared to a monomer concentration of 20% for the change of solution viscosity at 30° C. by a E-type viscometer. More specifically, assuming that the solution viscosity of the polyamic acid solution immediately after the preparation is P1 and the solution viscosity measured after standing for 90 days in an atmosphere at 5° C. is P2, the solution stability was rated A (good) when the rate of change in the solution viscosity determined according to the following formula was ±10% or less, and rated B (bad) when ±10% or more.

$$\text{Rate of change (\%)} \{(P2-P1)/P1\} \times 100$$

(Evaluation of Rate of Outgas Generation [TGA Measurement Method])
The temperature was raised from room temperature (25° C.) to 600° C. at 10° C./min by using a thermal analyzer TG-DTA2000S manufactured by Mac Science Co., Ltd., and the rate of weight decrease in each temperature region was computed. The weight decrease is considered to be attributable to outgas generation and therefore, in the present invention, the rate of weight decrease was evaluated as an indication of the rate of outgas generation.
(Evaluation of Bulging)
A polyimide film of 10 cm×10 cm was produced on a glass plate, and the surface of the obtained polyimide film was observed with an eye. The region where bulging was generated was examined, and the film was rated A (good) when a bulged region was not observed, rated B (fair) when the bulged region accounted for 30% or less of the entire area, and rated C (bad) when the bulged region accounted for more than 30%.

Example 1

In a glass-made reaction vessel having an internal volume of 500 ml and being equipped with a stirrer and a nitrogen gas inlet/outlet tube, 400.0 g of N-methyl-2-pyrrolidone as a solvent was added and after adding thereto 26.8801 g (0.2485 mol) of PPD and 73.1199 g (0.2485, mol) of s-BPDA, the mixture was stirred at 50° C. for 10 hours to obtain a polyamic acid solution having a solid content concentration of 18.7%, a solution viscosity of 5 Pa·s and a logarithmic viscosity of 0.65. To this polyamic acid solution composition, 50.0 g (11 mass % based on the entire solvent amount) of xylene was added to obtain a uniformly dissolved polyamic acid solution composition.

The obtained polyamic acid solution composition was coated on a glass plate serving as a substrate by a bar coater, and the coating film was heat-treated at 120° C. and 150° C. each for 10 minutes, at 180° C. for 60 minutes, at 200° C. and 250° C. each for 10 minutes, and at 450° C. for 30 minutes to obtain a laminate having a glass plate and a polyimide film with a thickness of 10

After the outer appearance on the polyimide film surface of the laminate was observed with an eye, TGA measurement was performed, and the rates of weight decrease in a temperature range of 500 to 550° C. and a temperature range of 550 to 600° C. were measured as an indication for evaluating the rate of outgas generation.

The results are shown in Table 1.

Examples 2 to 7

The same operations as in Example 1 were performed except for changing the kind or ratio of the mixed solvent or the heat treatment conditions as shown in Table 1.

The results are shown in Table 1.

Comparative Examples 1 to 6

The same operations as in Example 1 were performed except for changing the kind or ratio of the mixed solvent or the heat treatment conditions as shown in Table 2.

The results are shown in Table 2.

TABLE 1

|  | Example 1 | Example 2 | Example 3 | Example 4 | Example 5 | Example 6 | Example 7 |
|---|---|---|---|---|---|---|---|
| Polyamic acid solution composition Polyamic acid formulation | | | | | | | |
| Tetracarboxylic acid component | s-BPDA | s-BPDA | s-BPDA | s-BPDA | s-BPDA | s-BPDA | s-BPDA |
| Diamine component | PPD | PPD | PPD | PPD | PPD | PPD | PPD |
| Solvent formulation | | | | | | | |
| NMP (mass %) | 89 | 80 | 73 | 80 | 80 | 80 | 80 |
| Xylene (mass %) | 11 | 20 | 27 | | 20 | 20 | 20 |
| Toluene (mass %) | | | | 20 | | | |
| Logarithmic viscosity (dL/g) | 0.65 | 0.65 | 0.65 | 0.65 | 0.65 | 0.65 | 2.7 |
| State of solution | uniformly dissolved | uniformly dissolved | uniformly dissolved | uniformly dissolved | uniformly dissolved | uniformly dissolved | uniformly dissolved |
| Solution stability | A | A | A | A | A | A | A |
| Laminate | | | | | | | |
| Heat treatment condition | A | A | A | A | B | A | A |
| Polyimide film thickness (μm) | 10 | 10 | 10 | 10 | 10 | 30 | 10 |
| Evaluation of bulging | A | A | A | A | A | A | A |
| Rate of weight decrease (outgas) | | | | | | | |
| 500-550° C. (%) | 1.2 | 1.2 | 1.1 | 1.0 | 1.4 | 1.2 | 1.4 |
| 500-600° C. (%) | 10.0 | 9.6 | 10.3 | 10.6 | 10.2 | 10.1 | 10.3 |

Heat treatment condition A:
Heat-treated at 120° C. and 150° C. each for 10 minutes, at 180° C. for 60 minutes, at 200° C. and 250° C. each for 10 minutes, and at 450° C. for 30 minutes.
Heat treatment condition B:
Heat-treated at 120° C. and 150° C. each for 30 minutes, at 180° C. for 60 minutes, at 200° C. and 250° C. each for 10 minutes, and at 450° C. for 30 minutes.
Heat treatment condition C:
Heat-treated at 80° C., 130° C., 180° C. and 250° C. each for 5 minutes, at 300° C., 350° C. and 400° C. each for 10 minutes, and at 450° C. for 30 minutes.

TABLE 2

|  | Comparative Example 1 | Comparative Example 2 | Comparative Example 3 | Comparative Example 4 | Comparative Example 5 | Comparative Example 6 |
|---|---|---|---|---|---|---|
| Polyamic acid solution composition Polyamic acid formulation | | | | | | |
| Tetracarboxylic acid component | s-BPDA | s-BPDA | s-BPDA | s-BPDA | s-BPDA | s-BPDA |
| Diamine component | PPD | PPD | PPD | PPD | PPD | PPD |
| Solvent formulation | | | | | | |
| NMP (mass %) | 100 | 100 | 100 | 80 | 62 | 100 |
| Xylene (mass %) | | | | 20 | 38 | |
| Toluene (mass %) | | | | | | |
| Logarithmic viscosity (dL/g) | 0.65 | 0.65 | 0.65 | 0.65 | 0.65 | 2.7 |
| State of solution | uniformly dissolved | uniformly dissolved | uniformly dissolved | uniformly dissolved | not uniformly dissolved | uniformly dissolved |
| Solution stability | A | A | A | A | | A |

TABLE 2-continued

|  | Comparative Example 1 | Comparative Example 2 | Comparative Example 3 | Comparative Example 4 | Comparative Example 5 | Comparative Example 6 |
|---|---|---|---|---|---|---|
| Laminate |  |  |  |  |  |  |
| Heat treatment condition | C | A | B | C | film could not | A |
| Polyimide film thickness (μm) | 10 | 10 | 10 | 10 | be formed | 10 |
| Evaluation of bulging | C | A | B | C |  | A |
| Rate of weight decrease (outgas) |  |  |  |  |  |  |
| 500-550° C. (%) | 1.7 | 1.9 | 1.8 | 1.3 |  | 1.5 |
| 500-600° C. (%) | 11.4 | 12.7 | 12.8 | 11.1 |  | 10.6 |

Heat treatment condition A:
Heat-treated at 120° C. and 150° C. each for 10 minutes, at 180° C. for 60 minutes, at 200° C. and 250° C. each for 10 minutes, and at 450° C. for 30 minutes.
Heat treatment condition B:
Heat-treated at 120° C. and 150° C. each for 30 minutes, at 180° C. for 60 minutes, at 200° C. and 250° C. each for 10 minutes, and at 450° C. for 30 minutes.
Heat treatment condition C:
Heat-treated at 80° C., 130° C., 180° C. and 250° C. each for 5 minutes, at 300° C., 350° C. and 400° C. each for 10 minutes, and at 450° C. for 30 minutes.

INDUSTRIAL APPLICABILITY

According to the production process of a polyimide film laminate of the present invention, a polyamic acid solution composition using, as a tetracarboxylic acid component, 3,3', 4,4',-biphenyltetracarboxylic dianhydride and/or pyromellitic dianhydride and using, as a diamine component, p-phenylenediamine is coated on a substrate and then heat-treated and a laminate having the substrate and a polyimide film can be thereby formed with good formability while suppressing bubbling or bulging. The polyimide film of this laminate is improved in the characteristics such as heat resistance and when another material is further stacked on the polyimide film of the laminate, a problem such as outgas attributable to the polyimide film can be reduced.

The invention claimed is:

1. A process for producing a polyimide film laminate comprising:
forming a coating film made of a polyamic acid solution composition in which a polyamic acid having a repeating unit represented by Formula (1) is dissolved in a mixed solvent containing an organic polar solvent and a solvent azeotropic with water, a ratio of the azeotropic solvent with water in all solvents being from 5 to 35 mass %, on a surface of a substrate to obtain a laminate having a substrate and a polyamic acid solution composition,
heat-treating said laminate having the substrate and the polyamic acid solution composition at least at a temperature of more than 150° C. to less than 200° C. for 10 minutes or more, and
then heat-treating the laminate in a temperature range with a maximum temperature of 400 to 550° C. to obtain a laminate having the substrate and a polyimide film:

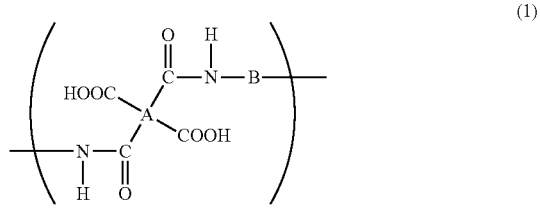

(1)

wherein 75 mol % or more of A of Formula (1) is a tetravalent unit based on a biphenyl structure represented by Formula (2) and/or a tetravalent unit based on a benzene ring structure represented by Formula (3), and 75 mol % or more of B of Formula (1) is a divalent unit based on a phenyl structure represented by Formula (4):

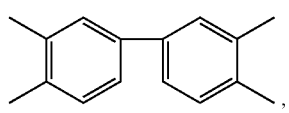

(2)

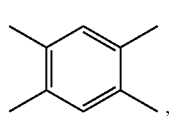

(3)

(4)

2. The process as claimed in claim 1, wherein logarithmic viscosity of the polyamic acid in the polyamic acid solution composition is 2.0 dL/g or less.

3. The process as claimed in claim 1, wherein thickness of the obtained polyimide film is 40 μm or less.

4. The process as claimed in claim 1, wherein another material is further stacked on the polyimide film surface of the polyimide film laminate to obtain a polyimide film laminate having the substrate, the polyimide film and the another material.

5. The process as claimed in claim 4, wherein the substrate is separated from the polyimide film laminate having the substrate, the polyimide film and the another material to obtain a polyimide film laminate having the polyimide and the another material.

6. A polyimide film laminate having a substrate and a polyimide film obtained by the process as claimed in claim 1.

7. A polyimide film laminate obtained by further stacking another material on the polyimide film surface of the polyimide film laminate as claimed in claim 6.

8. A laminate of a polyamide film and another material produced by separating the substrate from the polyimide film laminate as claimed in claim 7.

9. The process as claimed in claim 2, wherein thickness of the obtained polyimide film is 40 μm or less.

10. The process as claimed in claim 2, wherein another material is further stacked on the polyimide film surface of the polyimide film laminate to obtain a polyimide film laminate having the substrate, the polyimide film and the another material.

11. The process as claimed in claim 3, wherein another material is further stacked on the polyimide film surface of the polyimide film laminate to obtain a polyimide film laminate having the substrate, the polyimide film and the another material.

12. A polyimide film laminate having a substrate and a polyimide film produced by the process as claimed in claim 2.

13. A polyimide film laminate having a substrate and a polyimide film produced by the process as claimed in claim 3.

14. A polyimide film laminate having a substrate and a polyimide film produced by the process as claimed in claim 4.

* * * * *

UNITED STATES PATENT AND TRADEMARK OFFICE
CERTIFICATE OF CORRECTION

| | | |
|---|---|---|
| PATENT NO. | : 9,187,676 B2 | Page 1 of 1 |
| APPLICATION NO. | : 13/810489 | |
| DATED | : November 17, 2015 | |
| INVENTOR(S) | : Nakayama et al. | |

It is certified that error appears in the above-identified patent and that said Letters Patent is hereby corrected as shown below:

In the specification

<u>In Column 11</u>

At line 17, please change "10" to --10 μm.--

Signed and Sealed this
First Day of March, 2016

Michelle K. Lee
*Director of the United States Patent and Trademark Office*